US008981841B2

(12) United States Patent
Ko et al.

(10) Patent No.: US 8,981,841 B2
(45) Date of Patent: Mar. 17, 2015

(54) SEMICONDUCTOR INTEGRATED CIRCUIT AND SEMICONDUCTOR SYSTEM INCLUDING THE SAME

(75) Inventors: Jae-Bum Ko, Gyeonggi-do (KR); Jong-Chern Lee, Gyeonggi-do (KR); Sang-Jin Byeon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 54 days.

(21) Appl. No.: 13/236,970

(22) Filed: Sep. 20, 2011

(65) Prior Publication Data

US 2012/0249229 A1 Oct. 4, 2012

(30) Foreign Application Priority Data

Mar. 30, 2011 (KR) .................. 10-2011-0028780

(51) Int. Cl.
*H01L 25/00* (2006.01)
*G11C 8/12* (2006.01)

(52) U.S. Cl.
CPC ....................... *G11C 8/12* (2013.01)
USPC ........................................................ 327/564

(58) Field of Classification Search
USPC ........ 327/524, 564; 365/233.11, 233, 185.01, 365/51, 191; 257/621
See application file for complete search history.

(56) References Cited

U.S. PATENT DOCUMENTS

| 7,420,831 | B2 * | 9/2008 | Seo et al. ......... 365/63 |
| 7,768,114 | B2 * | 8/2010 | Choi ............. 257/686 |
| 7,821,851 | B2 * | 10/2010 | Kim ............. 365/191 |
| 8,030,739 | B2 * | 10/2011 | Chung ........... 257/621 |
| 2009/0168518 | A1 * | 7/2009 | Seong ......... 365/185.05 |
| 2011/0102065 | A1 * | 5/2011 | Jin et al. ......... 327/524 |
| 2011/0102066 | A1 * | 5/2011 | Jin et al. ......... 327/524 |

FOREIGN PATENT DOCUMENTS

KR 100905816 7/2009

OTHER PUBLICATIONS

Office Action issued from the Korean Intellectual Property Office on Aug. 27, 2012.

* cited by examiner

*Primary Examiner* — Harry Behm
*Assistant Examiner* — Afework Demisse
(74) *Attorney, Agent, or Firm* — IP & T Group LLP

(57) ABSTRACT

A semiconductor integrated circuit includes a plurality of semiconductor chips respectively selected in response to a plurality of chip selection signals, and a chip selection signal generator configured to generate the chip selection signals in response to one first control signal for deciding whether to drive the semiconductor chips and at least one second control signal for selecting at least one semiconductor chip from among the semiconductor chips.

15 Claims, 9 Drawing Sheets

US 8,981,841 B2

1

SEMICONDUCTOR INTEGRATED CIRCUIT AND SEMICONDUCTOR SYSTEM INCLUDING THE SAME

CROSS-REFERENCE TO RELATED APPLICATIONS

The present application claims priority of Korean Patent Application No. 10-2011-0028780, filed on Mar. 30, 2011, which is incorporated herein by reference in its entirety.

BACKGROUND

1. Field

Exemplary embodiments of the present invention relate to a semiconductor design, and more particularly, to a semiconductor integrated circuit and a semiconductor system including the semiconductor integrated circuit.

2. Description of the Related Art

In this specification, the technology of the present invention is described by taking a semiconductor memory device as an example.

In general, a semiconductor memory device, such as a Dynamic Random Access Memory (DRAM) device, is fabricated by stacking and packaging a plurality of semiconductor chips, or die, to acquire greater capacity than before from the same area. Herein, a semiconductor memory device where one semiconductor chip is stacked and packaged is referred to as a single-die package (SDP), and a semiconductor memory device where two semiconductor chips are stacked and packaged is referred to as a dual-die package (DDP). A semiconductor memory device where four semiconductor chips are stacked and packaged is referred to as a quad-die package (QDP).

Meanwhile, whether to drive the stacked and packaged semiconductor chips is controlled based on a chip selection signal applied from an external controller to each semiconductor chip.

FIG. 1A illustrates a semiconductor system including a single-die package according to prior art, and FIG. 1B illustrates a semiconductor system including a dual-die package according to prior art. FIG. 1C illustrates a semiconductor system including a quad-die package according to prior art.

Referring to FIG. 1A, the semiconductor system 10 includes a first external controller 11 and first to fourth single-die packages 13, 15, 17 and 19. The first external controller 11 generates first to fourth chip selection signals CS0#, CS1#, CS2# and CS3#. Meanwhile, the first to fourth single-die packages 13, 15, 17 and 19, each having a semiconductor chip (not shown), are driven, respectively, in response to the first to fourth chip selection signals CS0#, CS1#, CS2# and CS3#.

Herein, the first external controller 11 independently controls which of the semiconductor chips included in the first to fourth single-die packages 13, 15, 17 and 19 is driven by independently applying the first to fourth chip selection signals CS0#, CS1#, CS2# and CS3# through the first to fourth channels CS_CH#0, CS_CH#1, CS_CH#2 and CS_CH#3, respectively. Typically, the first to fourth chip selection signals CS0#, CS1#, CS2# and CS3# are low active signals.

The first to fourth single-die packages 13, 15, 17 and 19 each include one pad CS_PIN0 for receiving the first to fourth chip selection signals CS0#, CS1#, CS2# and CS3#, respectively. Since the first to fourth single-die packages 13, 15, 17 and 19 are under the control of the first external controller 11, the first to fourth single-die packages 13, 15, 17 and 19 transfer/receive various signals to/from the first external controller 11. For example, the semiconductor chip included in

2 each of the first to fourth single-die packages 13, 15, 17 and 19 is driven according to the corresponding chip selection signal CS0#, CS1#, CS2# or CS3#, and performs a write operation for storing a data (not shown) applied from the first external controller 11 in response to a command and an address (not shown) that are transferred from the first external controller 11, or performs a read operation for providing a stored data (not shown) to the first external controller 11.

Referring to FIG. 1B, the semiconductor system 20 includes a second external controller 21, a first dual-die package 23, and a second dual-die package 25. The second external controller 21 generates the first to fourth chip selection signals CS0#, CS1#, CS2# and CS3#. The first dual-die package 23 independently drives two semiconductor chips (not shown) included therein in response to the first and second chip selection signals CS0# and CS1#. Likewise, the second dual-die package 25 independently drives two semiconductor chips (not shown) included therein in response to the third and fourth chip selection signals CS2# and CS3#.

Herein, the second external controller 21 independently controls whether to drive the two semiconductor chips included in each of the first and second dual-die packages 23 and 25 by independently applying the first to fourth chip selection signals CS0#, CS1#, CS2# and CS3# through the first to fourth channels CS_CH#0, CS_CH#1, CS_CH#2 and CS_CH#3, just as the first external controller 11 illustrated in FIG. 1A does.

Moreover, the first and second dual-die packages 23 and 25 each include two pads CS_PIN0 and CS_PIN1 for receiving two chip selection signals CS0# and CS1# or CS2# and CS3#, respectively. Meanwhile, since the first and second dual-die packages 23 and 25 are under the control of the second external controller 21, the first and second dual-die packages 23 and 25 transfer/receive various signals to/from the second external controller 21. For example, the two semiconductor chips included in each of the first and second dual-die packages 23 and 25 are driven based on the corresponding chip selection signals of the first to fourth chip selection signals CS0#, CS1#, CS2# and CS3#, and the semiconductor chips perform a write operation for storing a data (not shown) applied from the second external controller 21 or perform a read operation for providing a stored data (not shown) to the second external controller 21 in response to a command and an address (not shown) transferred from the second external controller 21.

Referring to FIG. 1C, the semiconductor system 30 includes a third external controller 31 for generating the first to fourth chip selection signals CS0#, CS1#, CS2# and CS3# and a quad-die package 33 which independently drives four semiconductor chips (not shown) included therein in response to the first to fourth chip selection signals CS0#, CS1#, CS2# and CS3#.

Herein, the third external controller 31 independently controls whether to drive the four semiconductor chips included in the quad-die package 33 by independently applying the first to fourth chip selection signals CS0#, CS1#, CS2# and CS3# through the first to fourth channels CS_CH#0, CS_CH#1, CS_CH#2 and CS_CH#3, just as the first external controller 11 illustrated in FIG. 1A does.

Moreover, the quad-die package 33 further includes four pads CS_PIN0, CS_PIN1, CS_PIN2 and CS_PIN3 for receiving the first to fourth chip selection signals CS0#, CS1#, CS2# and CS3#. Meanwhile, since the quad-die package 33 is under the control of the third external controller 31, the quad-die package 33 transfers/receives various signals to/from the third external controller 31. For example, the four semiconductor chips included in the quad-die package 33 are driven based on the corresponding chip selection signals CS0#, CS1#, CS2# and CS3#, and perform a write operation for storing a data (not shown) applied from the third external controller 31 or perform a read operation for providing a stored data (not shown) to the third external controller 31 in response to a command and an address (not shown) transferred from the third external controller 31.

The known semiconductor systems 10, 20 and 30 having the above structures, however, have the following drawbacks.

First, the number of channels for applying chip selection signals increases as the number of semiconductor chips included therein increases. For example, the first external controller 11 requires the first channel CS_CH#0 to control the first single-die package 13, and the second external controller 21 requires the first and second channels CS_CH#0 and CS_CH#1 to control the first dual-die package 23. The third external controller 31 requires the first to fourth channels CS_CH#0, CS_CH#1, CS_CH#2 and CS_CH#3 to control the quad-die package 33. Accordingly, when 8, 16, or 32 semiconductor chips are stacked and packaged in a semiconductor package, an external controller requires as many channels as the number of the semiconductor chips. Considering that integration degree of semiconductor devices is increasing, an increase in the number of channels is a notable limitation.

Furthermore, the semiconductor packages 13, 15, 17, 19, 23, and 33 require as many pads as the number of the semiconductor chips included therein. For example, the first single-die package 13 includes one pad CS_PIN0 for receiving the first chip selection signal CS0#, and the first dual-die package 23 includes two pads CS_PIN0 and CS_PIN1 for receiving the first and second chip selection signals CS0# and CS1#. The quad-die package 33 includes four pads CS_PIN0, CS_PIN1, CS_PIN2 and CS_PIN3 for receiving the first to fourth chip selection signals CS0#, CS1#, CS2# and CS3#. When 8, 16 or 32 semiconductor chips are stacked and packaged, there are as many pads as the number of the semiconductor chips. However, as stack and packaging technology advances, that is, as the number of semiconductor chips that are stacked and packaged increases, an increase in the number of pads is inevitable. Therefore, there is a demand for a method that addresses the concern of the increasing area used for the pads.

SUMMARY

Exemplary embodiments of the present invention are directed to a semiconductor integrated circuit with a reduced number of pads for receiving chip selection signals.

Other exemplary embodiments of the present invention are directed to a semiconductor system in which the area of a semiconductor integrated circuit controlled by an external controller is reduced while the number of channels of the external controller is reduced as well.

In accordance with an exemplary embodiment of the present invention, a semiconductor integrated circuit includes a plurality of semiconductor chips respectively selected in response to a plurality of chip selection signals and a chip selection signal generator configured to generate the chip selection signals in response to one first control signal for deciding whether to drive the semiconductor chips and at least one second control signal for selecting at least one semiconductor chip from among the semiconductor chips.

The semiconductor integrated circuit may further include a plurality of pads configured to receive the first control signal and the at least one second control signal. The number of the pads may be equal to or less than the number of the semiconductor chips.

In accordance with another exemplary embodiment of the present invention, a semiconductor integrated circuit includes a plurality of semiconductor chips respectively selected in response to a plurality of chip selection signals, and a chip selection signal generator configured to generate the chip selection signals in response to at least one first control signal for deciding whether to drive the semiconductor chips and one second control signal for selecting at least one semiconductor chip from among the semiconductor chips.

The semiconductor integrated circuit may further include a plurality of pads configured to receive the at least one first control signal and the second control signal. The number of the pads may be equal to or less than the number of the semiconductor chips.

In accordance with yet another exemplary embodiment of the present invention, a semiconductor system includes a controller configured to generate a plurality of first control signals for controlling whether to drive a semiconductor chip and at least one second control signal for controlling which semiconductor chip to select, and a plurality of semiconductor integrated circuits, each of which includes a plurality of semiconductor chips and is configured to select at least one semiconductor chip from among the semiconductor chips in response to a first control signal, corresponding to the selected semiconductor chip, from among the plurality of first control signals and the at least one second control signal.

Each of the semiconductor integrated circuits may further include a first pad for receiving the first control signal corresponding to the selected semiconductor chip from among the plurality of first control signals, and at least one second pad for receiving the at least one second control signal.

In accordance with still another exemplary embodiment of the present invention, a semiconductor system includes a controller configured to generate at least one first control signal for controlling whether to drive a semiconductor chip and at least one second control signal for controlling which semiconductor chip to select, and a semiconductor integrated circuit, including a plurality of semiconductor chips, and configured to select at least one semiconductor chip from among the semiconductor chips, in response to the at least one first control signal and the at least one second control signal.

Additionally, the semiconductor integrated circuit may further include at least one first pad for receiving the at least one first control signal, and at least one second pad for receiving the at least one second control signal.

DETAILED DESCRIPTION

Figure 1A:
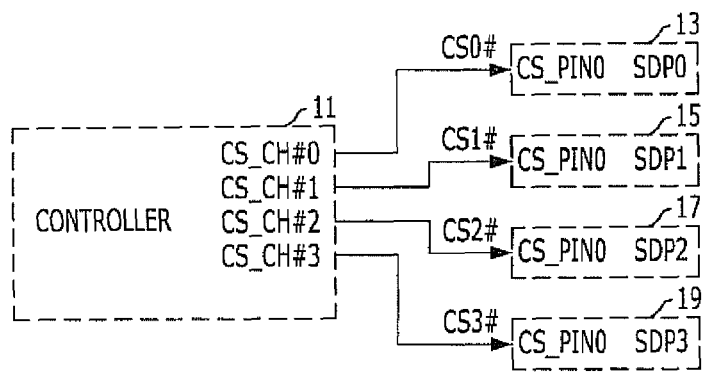
FIGS. 1A to 1C are block views illustrating known semiconductor systems.
Figure 1B:
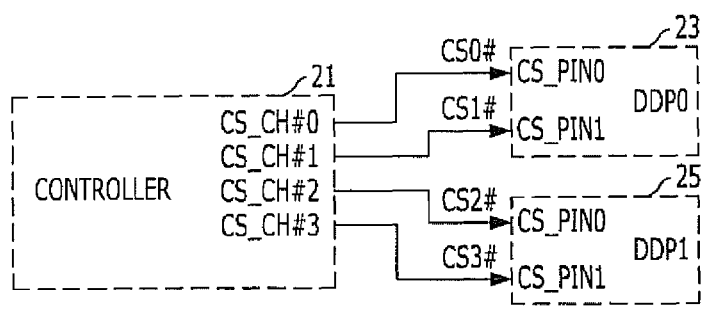
Figure 1C:
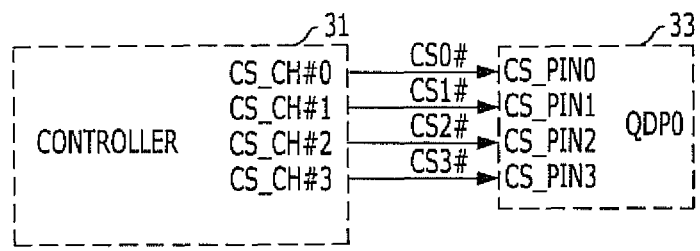

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Herein, a semiconductor integrated circuit in which a plurality of semiconductor chips are stacked and packaged so as to have a three-dimensional (3D) stack package structure is referred to as a semiconductor package.

Also herein, a case where two semiconductor packages are provided is taken as an example, although it should be understood that any number of semiconductor packages may be provided.

Figure 2:
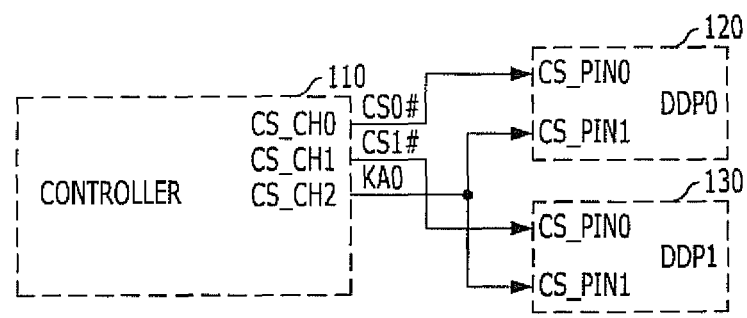
FIG. 2 is a block view illustrating a semiconductor system in accordance with a first exemplary embodiment of the present invention.

FIG. 2 is a block view illustrating a semiconductor system in accordance with a first exemplary embodiment of the present invention.

Referring to FIG. 2, a semiconductor system 100 includes an external controller 110, a first semiconductor package 120, and a second semiconductor package 130. The external controller 110 generates a first chip driving control signal CS0# and a second chip driving control signal CS1# for controlling whether or not to drive a semiconductor chip, and generates a common chip selection control signal KA0 for controlling whether to select a semiconductor chip. The first semiconductor package 120 includes two semiconductor chips therein. Either one of the two semiconductor chips may be selected in response to the first chip driving control signal CS0# and the common chip selection control signal KA0. Similarly, the second semiconductor package 130 includes two semiconductor chips therein, and either one of the two semiconductor chips may be selected in response to the second chip driving control signal CS1# and the common chip selection control signal KA0. As described above, a corresponding chip driving control signal (e.g., CS0# and CS1#) is provided for each of the semiconductor packages (e.g., first and second semiconductor packages 120 and 130).

Herein, the external controller 110 outputs the first chip driving control signal CS0#, the second chip driving control signal CS1#, and the common chip selection control signal KA0 through independent channels CS_CH0, CS_CH1 and CS_CH2, respectively. The external controller 110 may generate the first chip driving control signal CS0#, the second chip driving control signal CS1#, and the common chip selection control signal KA0 using an encoding method. In other words, the first chip driving control signal CS0#, the second chip driving control signal CS1#, and the common chip selection control signal KA0 may be encoded signals.

The first semiconductor package 120 and the second semiconductor package 130 are dual-die packages (DDP) each of which includes two semiconductor chips stacked and packaged. Accordingly, the first and second semiconductor packages 120 and 130 each have 2 ranks. Based on the number of ranks of each of the semiconductor packages, the number of pads in each of the semiconductor packages can be determined. The relationship between the number of ranks and number of pads is shown by Equation 1 below.

$$\# \text{ of pads} = (\log_2 x) + 1, \quad \quad \text{Equation 1:}$$

where 'x' is the number of ranks of the semiconductor package.

As shown in FIG. 2, the first semiconductor package 120 and the second semiconductor package 130 each include two pads CS_PIN0 and CS_PIN1. In the first semiconductor package 120, the two pads CS_PIN0 and CS_PIN1 are used to receive the first chip driving control signal CS0# and the common chip selection control signal KA0. Meanwhile, in the second semiconductor package 130, the two pads CS_PIN0 and CS_PIN1 are used to receive the second chip driving control signal CS1# and the common chip selection control signal KA0. Accordingly, the first semiconductor package 120 may read the first chip driving control signal CS0# and the common chip selection control signal KA0 based on a decoding method so as to produce internalized signals and use the internalized signals as a first chip selection signal LRA_CS0B and a second chip selection signal LRA_CS1B. Likewise, the second semiconductor package 130 may read the second chip driving control signal CS1# and the common chip selection control signal KA0 based on a decoding method so as to produce its own internalized signals that are used for selecting either of the two semiconductor chips therein.

Figure 3:
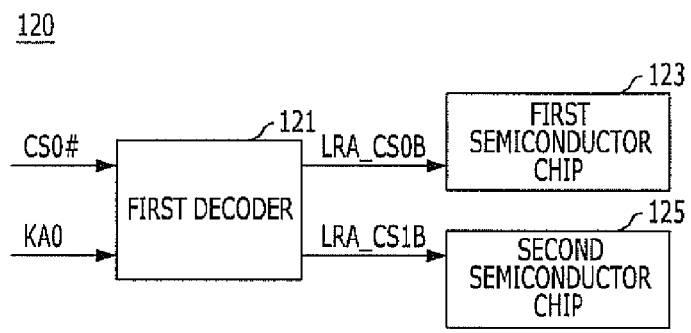
FIG. 3 is an internal block view exemplarily illustrating a first semiconductor package shown in FIG. 2.
Figure 4:
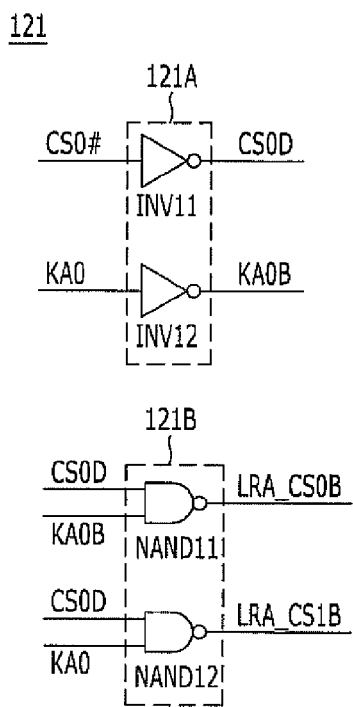
FIG. 4 is an internal circuit diagram exemplarily illustrating a first decoder shown in FIG. 3.

FIG. 3 is an internal block view exemplarily illustrating the first semiconductor package 120 shown in FIG. 2. FIG. 4 is an internal circuit diagram exemplarily illustrating a first decoder 121 shown in FIG. 3.

Referring to FIG. 3, the first semiconductor package 120 includes the first decoder 121 and first and second semiconductor chips 123 and 125. The first decoder 121 is configured to generate the first chip selection signal LRA_CS0B and the second chip selection signal LRA_CS1B by decoding the first chip driving control signal CS0# and the common chip selection control signal KA0. The first and second semiconductor chips 123 and 125 are selected based on the first chip selection signal LRA_CS0B and the second chip selection signal LRA_CS1B, respectively.

As illustrated in FIG. 4, the first decoder 121 includes an inverting unit 121A and a logic combining unit 121B. The inverting unit 121A inverts the first chip driving control signal CS0# and the common chip selection control signal KA0, and outputs inverted signals CS0D and KA0B. The logic combining unit 121B logically combines the common chip selection control signal KA0 and the output signals CS0D and KA0B of the inverting unit 121A, and outputs a first chip selection signal LRA_CS0B and a second chip selection signal LRA_CS1B. The inverting unit 121A includes first and second inverting circuits INV11 and INV12 for respectively inverting the first chip driving control signal CS0# and the common chip selection control signal KA0. The logic combining unit 121B may include a first NAND gate NAND11 and a second NAND gate NAND12. The first NAND gate NAND11 may be configured to perform a NAND operation onto the inverted first chip driving control signal CS0D and the inverted common chip selection control signal KA0B, and to output the first chip selection signal LRA_CS0B. Meanwhile, the second NAND gate NAND12 may be configured to perform a NAND operation onto the inverted first chip driving control signal CS0D and the common chip selection control signal KA0, and to output the second chip selection signal LRA_CS1B.

Since the second semiconductor package 130 has the same structure as the first semiconductor package 120, which is described above, a detailed description of the second semiconductor package 130 is omitted herein.

Hereafter, the operation of the semiconductor system 100 having the above-described structure is described in accordance with the first exemplary embodiment of the present invention.

The external controller 110 generates the first chip driving is control signal CS0#, the second chip driving control signal CS1#, and the common chip selection control signal KA0, and outputs them to the first semiconductor package 120 and the second semiconductor package 130.

First, with regards to the first semiconductor package 120, the first decoder 121 generates the first chip selection signal LRA_CS0B and the second chip selection signal LRA_CS1B by decoding the first chip driving control signal CS0# and the common chip selection control signal KA0, which are encoded signals, and outputs them to the first semiconductor chip 123 and the second semiconductor chip 125, respectively. Herein, the first chip selection signal LRA_CS0B and the second chip selection signal LRA_CS1B are as shown in the following Table 1.

TABLE 1

| CS0# | KA0 | LAR_CS0B | LAR_CS1B |
|------|-----|----------|----------|
| L | L | L | H |
| L | H | H | L |
| H | L | H | H |
| H | H | H | H |

Referring to Table 1, the first chip selection signal LRA_CS0B is enabled to a logic low level when the first chip driving control signal CS0# is at a logic low level and the common chip selection control signal KA0 is at a logic low level. The second chip selection signal LRA_CS1B is enabled to a logic low level when the first chip driving control signal CS0# is at a logic low level and the common chip selection control signal KA0 is at a logic high level. In other words, the first decoder 121 selectively enables the first chip selection signal LRA_CS0B and the second chip selection signal LRA_CS1B according to the logic level of the common chip selection control signal KA0 when the first chip driving control signal CS0# is enabled to a logic low level. Of course, the first decoder 121 disables the first chip selection signal LRA_CS0B and the second chip selection signal LRA_CS1B regardless of the logic level of the common chip selection control signal KA0 when the first chip driving control signal CS0# is disabled to a logic high level.

The first and second semiconductor chips 123 and 125 are selectively enabled according to the first chip selection signal LRA_CS0B and the second chip selection signal LRA_CS1B that are selectively enabled. And, when the first and second semiconductor chips 123 and 125 are enabled, they perform a desired operation under the control of the external controller 110.

Briefly, the second semiconductor package 130 receives the second chip driving control signal CS1# instead of the first chip driving control signal CS0#, and accordingly, the two semiconductor chips included in the second semiconductor package 130 are selectively enabled in response to the second chip driving control signal CS1# and the common chip selection control signal KA0. Since the operation of the second semiconductor package 130 is the same as the operation of the first semiconductor package 120, further description of the operation of the second semiconductor package 130 is omitted herein.

Figure 5:
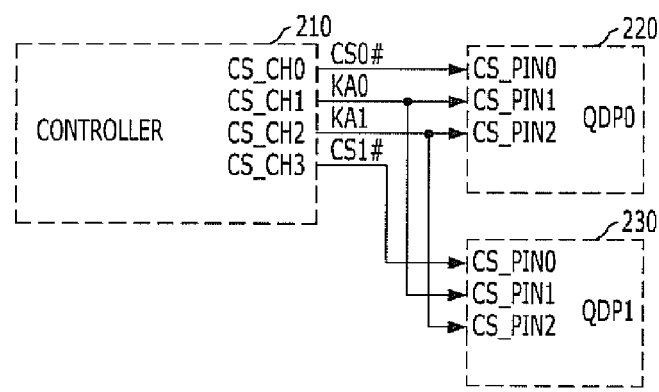
FIG. 5 is a block view illustrating a semiconductor system in accordance with a second exemplary embodiment of the present invention.

FIG. 5 is a block view illustrating a semiconductor system in accordance with a second exemplary embodiment of the present invention.

In the second exemplary embodiment of the present invention, signals performing similar functions as those of the first exemplary embodiment and structures related to the signals are referred to with the same reference numerals.

Referring to FIG. 5, the semiconductor system 200 includes an external controller 210, a first semiconductor package 220, and a second semiconductor package 230. Here, similar to FIG. 2, there are two semiconductor packages (e.g., first and second semiconductor packages 220 and 230), and thus, two respective chip driving control signals are used. Accordingly, the external controller 210 generates a first chip driving control signal CS0# and a second chip driving control signal CS1# for controlling whether or not to drive a semiconductor chip, and generates a first common chip selection control signal KA0 and a second common chip selection control signal KA1 for controlling when a semiconductor chip is selected. The first semiconductor package 220 includes four semiconductor chips therein. Any one of the four semiconductor chips in the first semiconductor package 220 may be selected in response to the first chip driving control signal CS1# and the first and second common chip selection control signals KA0 and KA1. Similarly, the second semiconductor package 230 includes four semiconductor chips therein, and any one of the four semiconductor chips may be selected in response to the second chip driving control signal CS1# and the first and second common chip selection control signals KA0 and KA1.

Herein, the external controller 210 outputs the first chip driving control signal CS0#, the second chip driving control signal CS1#, the first common chip selection control signal KA0, and the second common chip selection control signal KA1 through independent channels CS_CH0, CS_CH1, CS_CH2 and CS_CH3. The external controller 210 may generate the first chip driving control signal CS0#, the second chip driving control signal CS1#, the first common chip selection control signal KA0, and the second common chip selection control signal KA1 using an encoding method. In other words, the first chip driving control signal CS0#, the second chip driving control signal CS1#, the first common chip selection control signal KA0, and the second common chip selection control signal KA1 may be encoded signals.

The first semiconductor package 220 and the second semiconductor package 230 are quad-die packages (QDP) each of which includes four semiconductor chips stacked and packaged. Accordingly, the first and second semiconductor packages 220 and 230 each have four ranks, and therefore, pursuant to Equation 1, the number of pads required in each of the first and second semiconductor packages 220 and 230 is three (3). Thus, as shown in FIG. 5, the first semiconductor package 220 and the second semiconductor package 230 each include three pads CS_PIN0, CS_PIN1, and CS_PIN2. In the first semiconductor package 220, the three pads CS_PIN0, CS_PIN1, and CS_PIN2 are used to receive the first chip driving control signal CS0# and the first and second common chip selection control signals KA0 and KA1. Meanwhile, in the second semiconductor package 230, the three pads CS_PIN0, CS_PIN1, and CS_PIN2 are used to receive the second chip driving control signal CS1# and the first and second common chip selection control signals KA0 and KA1. Accordingly, the first semiconductor package 220 may read the first chip driving control signal CS0# and the first and second common chip selection control signals KA0 and KA1 based on a decoding method so as to produce internalized signals and use the internalized signals as first to fourth chip selection signals LRA_CS0B, LRA_CS1B, LRA_CS2B and LRA_CS3B. Likewise, the second semiconductor package 230 may read the second chip driving control signal CS1# and the first and second chip selection control signals KA0 and KA1 based on a decoding method so as to produce internalized signals that are used for selecting any of the four semiconductor chips therein.

Figure 6:
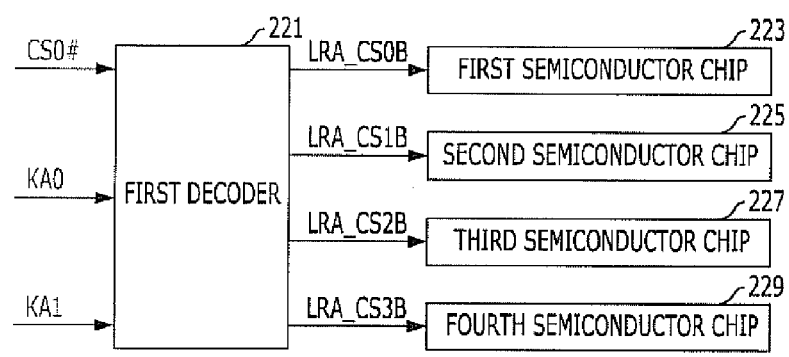
FIG. 6 is an internal block view exemplarily illustrating a first semiconductor package shown in FIG. 5.
Figure 7:
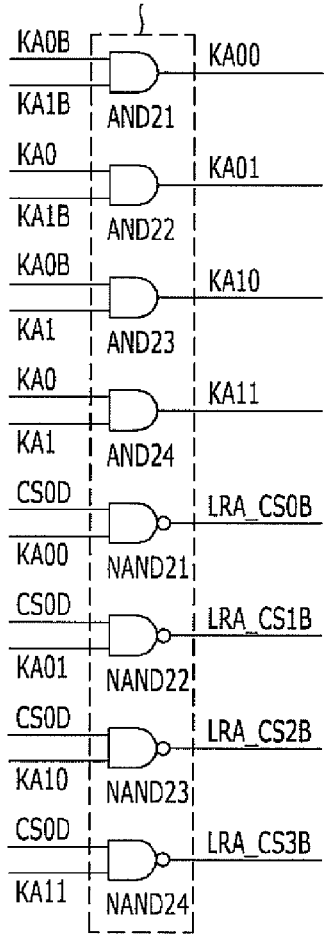
FIG. 7 is an internal circuit diagram exemplarily illustrating a first decoder shown in FIG. 6.

FIG. 6 is an internal block view exemplarily illustrating the first semiconductor package 220 shown in FIG. 5. FIG. 7 is an internal circuit diagram exemplarily illustrating a first decoder 221 shown in FIG. 6.

Referring to FIG. 6, the first semiconductor package 220 includes the first decoder 221 and first to fourth semiconductor chips 223, 225, 227, and 229. The first decoder 221 is configured to generate the first to fourth chip selection signals LRA_CS0B, LRA_CS0B, LRA_CS2B and LRA_CS3B by decoding the first chip driving control signal CS0# and the first and second common chip selection control signals KA0 and KA1. The first to fourth semiconductor chips 223, 225, 227 and 229 are selected based on the first to fourth chip selection signals LRA_CS0B, LRA_CS1B, LRA_CS2B and LRA_CS3B, respectively.

As illustrated in FIG. 7, the first decoder 221 includes an inverting unit 221A and a logic combining unit 221B. The inverting unit 221A inverts the first chip driving control signal CS0# and the first and second common chip selection control signals KA0 and KA1, and outputs inverted signals CS0D, KA0B and KA1B. The logic combining unit 221B logically combines the first and second common chip selection control signals KA0 and KA1 and the output signals CS0D, KA0B and KA1B of the inverting unit 221A, and outputs first to fourth chip selection signals LRA_CS0B, LRA_CS1B, LRA_CS2B and LRA_CS3B.

The inverting unit 221A includes first to third inverting circuits INV21, INV22 and INV23 for respectively inverting the first chip driving control signal CS0# and the first and second common chip selection control signals KA0 and KA1.

The logic combining unit 221B may include a first AND gate AND21, a second AND gate AND22, a third AND gate AND23, and a fourth AND gate AND24. The first AND gate AND21 may be configured to perform an AND operation onto the inverted first and second common chip selection control signals KA0B and KA1B, and to output a first logic signal KA00. The second AND gate AND22 may be configured to perform an AND operation onto the first common chip selection control signal KA0 and the inverted second common chip selection control signal KA1B, and to output a second logic signal KA01. The third AND gate AND23 may be configured to perform an AND operation onto the inverted first common chip selection control signal KA0B and the second common chip selection control signal KA1, and to output a third logic signal KA10. The fourth AND gate AND24 may be configured to perform an AND operation onto the first and second common chip selection control signals KA0 and KA1, and to output a fourth logic signal KA11. Also, the logic combining 221B may further include a first NAND gate NAND21, a second NAND gate NAND22, a third NAND gate NAND23, and a fourth NAND gate NAND24. The first NAND gate NAND21 may be configured to perform a NAND operation onto the inverted first chip driving control signal CS0D and the first logic signal KA00, and to output a first chip selection signal LRA_CS0B. The second NAND gate NAND22 may be configured to perform a NAND operation onto the inverted first chip driving control signal CS0D and the second logic signal KA01, and to output a second chip selection signal LRA_CS1B. The third NAND gate NAND23 may be configured to perform a NAND operation onto the inverted first chip driving control signal CS0D and the third logic signal KA10, and to output a third chip selection signal LRA_CS0B. The fourth NAND gate NAND24 may be configured to perform a NAND operation onto the inverted first chip driving control signal CS0D and the fourth logic signal KA11, and to output a fourth chip selection signal LRA_CS3B.

Since the second semiconductor package 230 has the same structure as the first semiconductor package 220, which is described above, a detailed description of the second semiconductor package 230 is omitted herein.

Hereafter, the operation of the semiconductor system 200 having the above-described structure is described in accordance with the second exemplary embodiment of the present invention.

The external controller 210 generates the first and second chip driving control signals CS0# and CS1# and the first and second common chip selection control signals KA0 and KA1, which are encoded signals, and outputs them to the first semiconductor package 220 and the second semiconductor package 230.

First, with regards to the first semiconductor package 220, the first decoder 221 generates the first to fourth chip selection signals LRA_CS0B, LRA_CS1B, LRA_CS2B and LRA_CS3B by decoding the first chip driving control signal CS0# and the first and second common chip selection control signals KA0 and KA1, which are encoded signals, and outputs them to the first to fourth semiconductor chips 223, 225, 227 and 229, respectively. Herein, the first to fourth chip selection signals LRA_CS0B, LRA_CS1B, LRA_CS2B and LRA_CS3B are as shown in the following Table 2.

TABLE 2

| CS0# | KA0 | KA1 | LAR_CS0B | LAR_CS1B | LAR_CS2B | LAR_CS3B |
|---|---|---|---|---|---|---|
| L | L | L | L | H | H | H |
| L | H | L | H | L | H | H |
| L | L | H | H | H | L | H |
| L | H | H | H | H | H | L |
| H | L | L | H | H | H | H |
| H | H | L | H | H | H | H |
| H | L | H | H | H | H | H |
| H | H | H | H | H | H | H |

Referring to Table 2, the first chip selection signal LRA_CS0B is enabled to a logic low level when the first chip driving control signal CS0# is at a logic low level and the first and second common chip selection control signals KA0 and KA1 are at a logic low level. The second chip selection signal LRA_CS1B is enabled to a logic low level when the first chip driving control signal CS0# is at a logic low level, the first common chip selection control signal KA0 is at a logic high level, and the second common chip selection control signal KA1 is at a logic low level. The third chip selection signal LRA_CS2B is enabled to a logic low level when the first chip driving control signal CS0# is at a logic low level, the first common chip selection control signal KA0 is at a logic low level, and the second common chip selection control signal KA1 is at a logic high level. The fourth chip selection signal LRA_CS0B is enabled to a logic low level when the first chip driving control signal CS0# is at a logic low level and the first and second common chip selection control signals KA0 and KA1 are both at a logic high level.

In other words, the first decoder 221 selectively enables the first to fourth chip selection signals LRA_CS0B, LRA_CS1B, LRA_CS2B and LRA_CS3B according to the logic level of the first and second common chip selection control signals KA0 and KA1 when the first chip driving control signal CS0# is enabled to a logic low level. Of course, the first decoder 221 disables the first to fourth chip selection signals LRA_CS0B, LRA_CS1B, LRA_CS2B and LRA_CS3B to a logic high level when the first chip driving control signal CS0# is disabled to a Logic high level, regardless of the logic level of the first and second common chip selection control signals KA0 and KA1.

Upon the selective enabling of the first to fourth chip selection signals LRA_CS0B, LRA_CS1B, LRA_CS2B and LRA_CS3B, the first to fourth semiconductor chips 223, 225, 227 and 229 are selectively enabled, and the enabled semiconductor chips perform a desired operation under the control of the external controller 210.

Briefly, the second semiconductor package 230 receives the second chip driving control signal CS1# instead of the first chip driving control signal CS0#, and accordingly, the four semiconductor chips included in the second semiconductor package 230 are selectively enabled in response to the second chip driving control signal CS1# and the first and second common chip selection control signals KA0 and KA1. Because the operation of the second semiconductor package 230 is the same as the operation of the first semiconductor package 220, further description of the operation of the second semiconductor package 230 is omitted herein.

Figure 8:
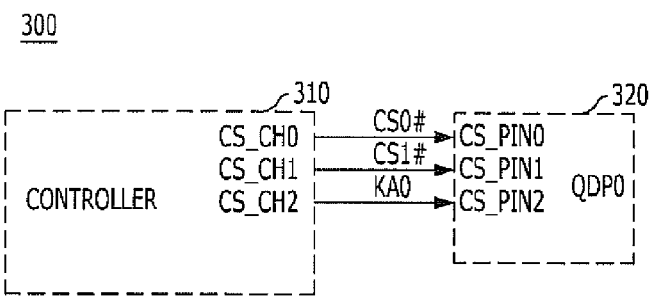
FIG. 8 is a block view illustrating a semiconductor system in accordance with a third exemplary embodiment of the present invention.

FIG. 8 is a block view illustrating a semiconductor system in accordance with a third exemplary embodiment of the present invention.

The third exemplary embodiment of the present invention shows a case where the applied decoding method of a semiconductor package is different from that of the second exemplary embodiment of the present invention. For this reason, the description of the third exemplary embodiment provided hereafter focuses on the differences from the second exemplary embodiment. For convenience, one external controller and one semiconductor package are described.

Also, in the third exemplary embodiment of the present invention, signals performing similar functions as those of the second exemplary embodiment and structures related to the signals are referred to with the same reference numerals.

Referring to FIG. 8, the semiconductor system 300 includes an external controller 310 and a semiconductor package 320. Because there is only one semiconductor package 320 in the semiconductor system 300, only one common chip selection control (e.g., KA0) is needed. Therefore, the other two signals generated by the external controller 310 may be chip driving control signals (e.g., CS0# and CS1#). Accordingly, the external controller 310 generates a first chip driving control signal CS0# and a second chip driving control signal CS1# for controlling whether or not to drive a semiconductor chip, and generates a common chip selection control signal KA0 for controlling when a semiconductor chip is selected. The semiconductor package 320 includes four semiconductor chips therein and any of the four semiconductor chips may be selected in response to the first chip driving control signal CS0#, the second chip driving control signal CS1#, and the common chip selection control signal KA0.

Herein, the external controller 310 outputs the first chip driving control signal CS0#, the second chip driving control signal CS1#, and the common chip selection control signal KA0 through independent channels CS_CH0, CS_CH1 and CS_CH2. The external controller 310 may generate the first chip driving control signal CS0#, the second chip driving control signal CS1#, and the common chip selection control signal KA0 using an encoding method. In other words, the first chip driving control signal CS0#, the second chip driving control signal CS1#, and the common chip selection control signal KA0 may be encoded signals.

The semiconductor package 320 is a quad-die package (QDP) which includes four semiconductor chips stacked and packaged. Accordingly, the semiconductor package 320 has four ranks, and therefore, pursuant to Equation 1, the number of pads required is three (3). Thus, as shown in FIG. 8, the semiconductor package 320 includes three pads CS_PIN0, CS_PIN1, and CS_PIN2 for receiving the first chip driving control signal CS0#, the second chip driving control signal CS1#, and the common chip selection control signal KA0, respectively. Accordingly, the semiconductor package 320 may read the first and second chip driving control signals CS0# and CS1# and the common chip selection control signal KA0 based on a decoding method so as to produce internalized signals that are used for selecting any of the four semiconductor chips therein.

Figure 9:
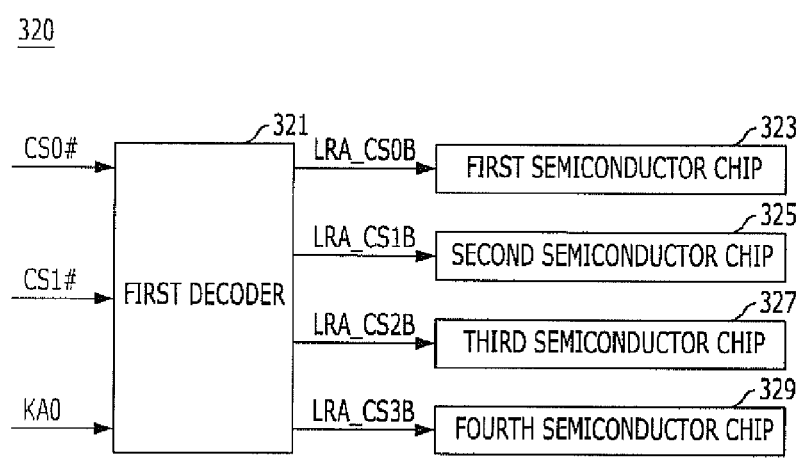
FIG. 9 is an internal block view exemplarily illustrating a first semiconductor package shown in FIG. 8.
Figure 10:
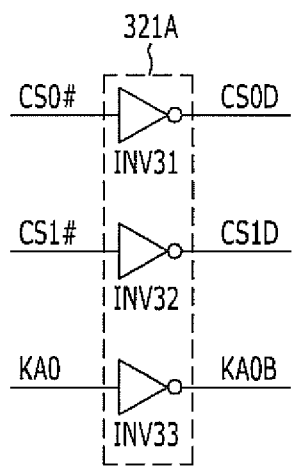
FIG. 10 is an internal circuit diagram exemplarily illustrating a first decoder shown in FIG. 9.
Figure 10:
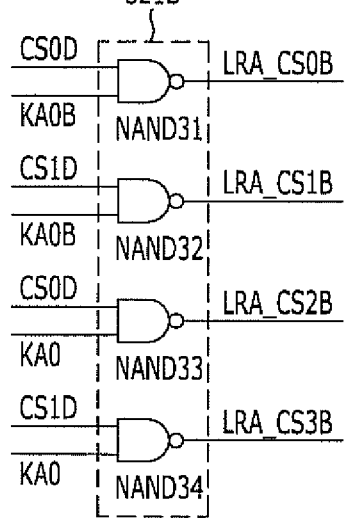

FIG. 9 is an internal block view exemplarily illustrating the semiconductor package 320 shown in FIG. 8. FIG. 10 is an internal circuit diagram exemplarily illustrating a first decoder 321 shown in FIG. 9.

Referring to FIG. 9, the semiconductor package 320 includes the first decoder 321 and first to fourth semiconductor chips 323, 325, 327, and 329. The first decoder 321 is configured to generate the first to fourth chip selection signals LRA_CS0B, LRA_CS1B, LRA_CS2B and LRA_CS3B by decoding the first chip driving control signal CS0#, the second chip driving control signal CS1#, and the common chip selection control signal KA0. The first to fourth semiconductor chips 323, 325, 327 and 329 are selected based on the first to fourth chip selection signals LRA_CS0B, LRA_CS1B, LRA_CS2B and LRA_CS3B, respectively.

As illustrated in FIG. 10, the first decoder 321 includes an inverting unit 321A and a logic combining unit 321B. The inverting unit 321A inverts the first chip driving control signal CS0#, the second chip driving control signal CS1#, and the common chip selection control signal KA0, and outputs inverted signals CS0D, CS1D, and KA0B. The logic combining unit 321B logically combines the common chip selection control signal KA0 and the output signals CS0D, CS1D, and KA0B of the inverting unit 321A, and outputs first to fourth chip selection signals LRA_CS0B, LRA_CS1B, LRA_CS2B and LRA_CS3B.

The inverting unit 321A includes first to third inverting circuits INV31, INV32 and INV33 for respectively inverting the first chip driving control signal CS0#, the second chip driving control signal CS1#, and the common chip selection control signal KA0.

The logic combining unit 321B may includes a first NAND gate NAND31, a second NAND gate NAND32, a third NAND gate NAND33, and a fourth NAND gate NAND34. The first NAND gate NAND31 may be configured to perform a NAND operation onto the inverted first chip driving control signal CS0D and the inverted common chip selection control signal KA0B, and to output a first chip selection signal LRA_CS0B. The second NAND gate NAND32 may be configured to perform a NAND operation onto the inverted second chip driving control signal CS1D and the inverted common chip selection control signal KA0B, and to output a second chip selection signal LRA_CS1B. The third NAND gate NAND33 may be configured to perform a NAND operation onto the inverted first chip driving control signal CS0D and the common chip selection control signal KA0, and to output a third chip selection signal LRA_CS2B. The fourth NAND gate NAND34 may be configured to perform a NAND operation onto the inverted second chip driving control signal CS1D and the common chip selection control signal KA0, and to output a fourth chip selection signal LRA_CS3B.

Hereafter, the operation of the semiconductor system 300 having the above-described structure is described in accordance with the third exemplary embodiment of the present invention.

The external controller 310 generates the first and second chip driving control signals CS0# and CS1# and the common chip selection control signal KA0, which are encoded signals, and outputs them to the semiconductor package 320.

The first decoder 321 generates the first to fourth chip selection signals LRA_CS0B, LRA_CS1B, LRA_CS2B and LRA_CS3B by decoding the first chip driving control signal CS0#, the second chip driving control signal CS1#, and the common chip selection control signal KA0, which are encoded signals, and outputs them to the first to fourth semiconductor chips 323, 325, 327 and 329, respectively. Herein, the first to fourth chip selection signals LRA_CS0B, LRA_CS1B, LRA_CS2B and LRA_CS3B are as shown in the following Table 3.

TABLE 3

| CS0# | CS1# | KA0 | LAR_CS0B | LAR_CS1B | LAR_CS2B | LAR_CS3B |
|---|---|---|---|---|---|---|
| L | H | L | L | H | H | H |
| H | L | L | H | L | H | H |
| L | H | H | H | H | L | H |
| H | L | H | H | H | H | L |
| L | L | L | L | L | H | H |
| L | L | H | H | H | L | L |
| H | H | L | H | H | H | H |
| H | H | H | H | H | H | H |

Referring to Table 3, the first chip selection signal LRA_CS0B is enabled to a logic low level when the first chip driving control signal CS0# is at a logic low level, the second chip driving control signal CS1# is at a logic high level, and the common chip selection control signal KA0 is at a logic low level. The second chip selection signal LRA_CS1B is enabled to a logic low level when the first chip driving control signal CS0# is at a logic high level, the second chip driving control signal CS1# is at a logic low level, and the common chip selection control signal KA0 is at a logic low level. The third chip selection signal LRA_CS2B is enabled to a logic low level when the first chip driving control signal CS0# is at a logic low level, the second chip driving control signal CS1# is at a logic high level, and the common chip selection control signal KA0 is at a logic high level. The fourth chip selection signal LRA_CS0B is enabled to a logic low level when the first chip driving control signal CS0# is at a logic high level, the second chip driving control signal CS1# is at a logic low level, and the common chip selection control signal KA0 is at a logic high level.

Meanwhile, the first decoder 321 may simultaneously enable the first and second chip selection signals LRA_CS0B and LRA_CS1B, or simultaneously enable the third and fourth chip selection signals LRA_CS2B and LRA_CS3B according to the logic level of the common chip selection control signal KA0 when both of the first chip driving control signal CS0# and the second chip driving control signal CS1# are at a logic low level. Further, the first decoder 321 disables the first to fourth chip selection signals LRA_CS0B, LRA_CS1B, LRA_CS2B and LRA_CS3B to a logic high level when the first chip driving control signal CS0# and the second chip driving control signal CS1# are disabled to a logic high level, regardless of the logic level of the common chip selection control signal KA0.

Upon the selective enabling of the first to fourth chip selection signals LRA_CS0B, LRA_CS1B, LRA_CS2B and LRA_CS3B, the first to fourth semiconductor chips 323, 325, 327 and 329 are selectively enabled, and the enabled semiconductor chips perform a desired operation under the control of the external controller 310.

Figure 11:
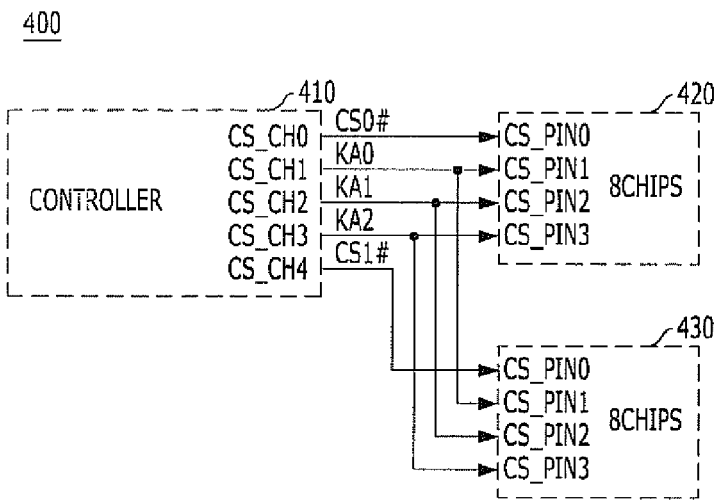
FIG. 11 is a block view illustrating a semiconductor system in accordance with a fourth exemplary embodiment of the present invention.

FIG. 11 is a block view illustrating a semiconductor system in accordance with a fourth exemplary embodiment of the present invention.

In the fourth exemplary embodiment of the present invention, signals performing similar functions as those of the above mentioned exemplary embodiments and structures related to the signals are referred to with the same reference numerals.

Referring to FIG. 11, the semiconductor system 400 includes an external controller 410, a first semiconductor package 420, and a second semiconductor package 430. Here, similar to FIGS. 2 and 5, there are two semiconductor packages (e.g., first and second semiconductor packages 420 and 430), and thus, two respective chip driving control signals are used. Accordingly, the external controller 410 generates a first chip driving control signal CS0# and a second chip driving control signal CS1# for controlling whether or not to drive a semiconductor chip, and generates a first common chip selection control signal KA0, a second common chip selection control signal KA1, and a third common chip selection control signal KA2 for controlling when a semiconductor chip is selected. The first semiconductor package 420 includes eight semiconductor chips therein. Any one of the eight semiconductor chips in the first semiconductor package 420 may be selected in response to the first chip driving control signal CS1# and the first, second, and third common chip selection control signals KA0, KA1, and KA2. Similarly, the second semiconductor package 430 includes eight semiconductor chips therein, and any one of the eight semiconductor chips may be selected in response to the second chip driving control signal CS1# and the first, second, and third common chip selection control signals KA0, KA1, and KA2.

Herein, the external controller 410 outputs the first chip driving control signal CS0#, the second chip driving control signal CS1#, the first common chip selection control signal KA0, the second common chip selection control signal KA1, and the third common chip selection control signal KA2 through independent channels CS_CH0, CS_CH1, CS_CH2, CS_CH3, and CS_CH4. The external controller 410 may generate the first chip driving control signal CS0#, the second chip driving control signal CS1#, the first common chip selection control signal KA0, the second common chip selection control signal KA1, and the third common chip selection control signal KA2 using an encoding method. In other words, the first chip driving control signal CS0#, the second chip driving control signal CS1#, the first common chip selection control signal KA0, the second common chip selection control signal KA1, and the third common chip selection control signal KA2 may be encoded signals.

The first semiconductor package 420 and the second L5 semiconductor package 430 each include eight semiconductor chips stacked and packaged. Accordingly, the first and second semiconductor packages 420 and 430 each have eight ranks, and therefore, pursuant to Equation 1, the number of pads required in each of the first and second semiconductor packages 420 and 430 is four (4). Thus, as shown in FIG. 11, the first semiconductor package 420 and the second semiconductor package 430 each include four pads CS_PIN0, CS_PIN1, CS_PIN2, CS_PIN3. In the first semiconductor package 420, the four pads CS_PIN0, CS_PIN1, CS_PIN2, and CS_PIN3 are used to receive the first chip driving control signal CS0# and the first, second, and third common chip selection control signals KA0, KA1, and KA2. Meanwhile, in the second semiconductor package 430, the four pads CS_PIN0, CS_PIN1, CS_PIN2, and CS_PIN3 are used to receive the second chip driving control signal CS1# and the first, second, and third common chip selection control signals KA0, KA1, and KA2. Accordingly, the first semiconductor package 420 may read the first chip driving control signal CS0# and the first, second, and third common chip selection control signals KA0, KA1, and KA2 based on a decoding method so as to produce internalized signals and use the internalized signals as first to eighth chip selection signals LRA_CS0B, LRA_CS1B, LRA_CS0B, LRA_CS3B, LRA_CS4B, LRA_CS0B, LRA_CS6B, and LRA_C70B. Likewise, the second semiconductor package 430 may read the second chip driving control signal CS1# and the first, second, and third chip selection control signals KA0, KA1, and KA2 based on a decoding method so as to produce internalized signals that are used for selecting any of the four semiconductor chips therein.

Figure 12:
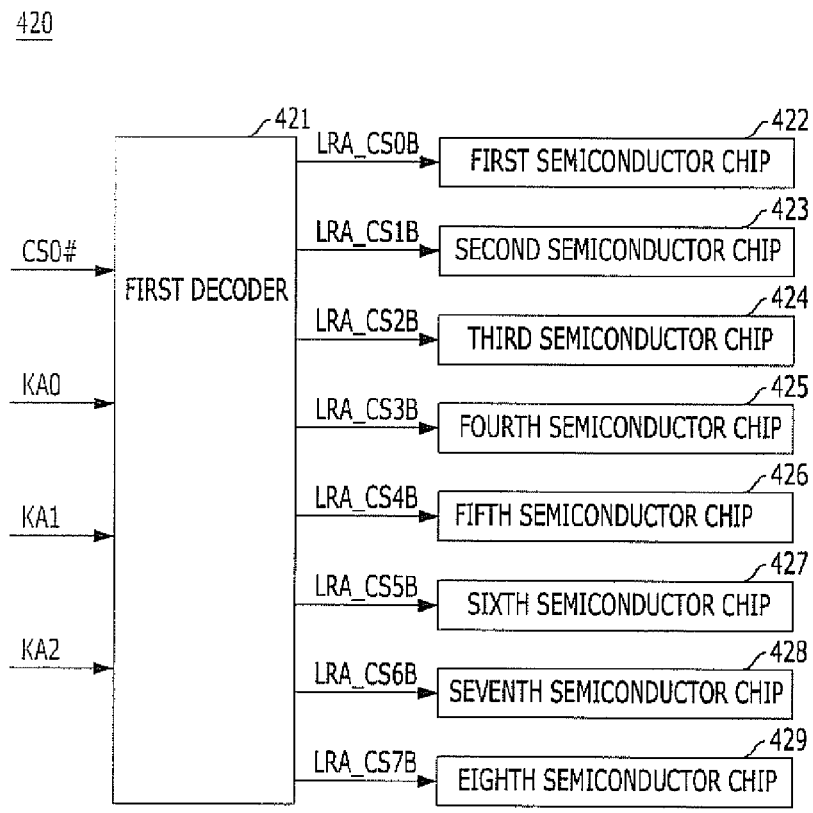
FIG. 12 is an internal block view exemplarily illustrating a first semiconductor package shown in FIG. 11.
Figure 13:
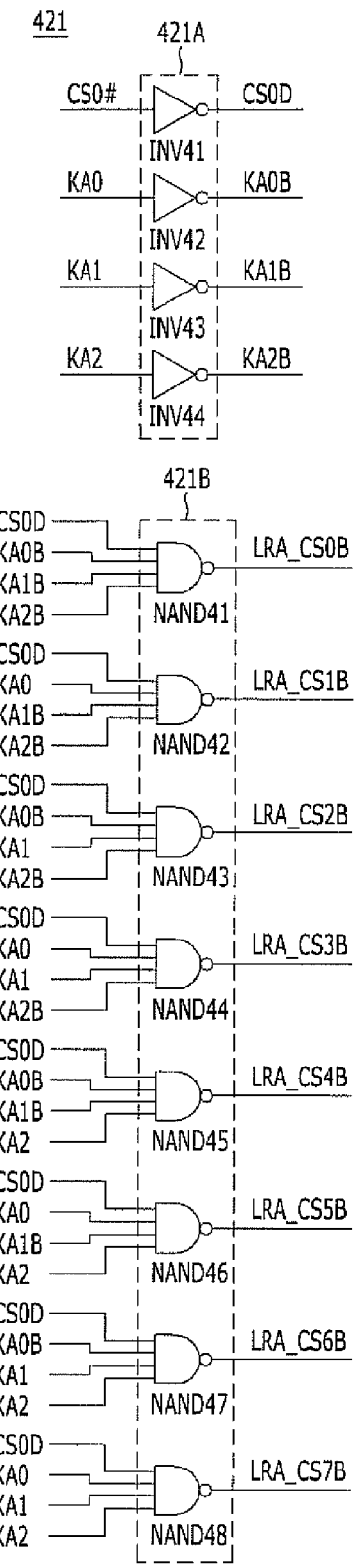
FIG. 13 is an internal circuit diagram exemplarily illustrating a first decoder shown in FIG. 12.

FIG. 12 is an internal block view exemplarily illustrating the first semiconductor package 420 shown in FIG. 11. FIG. 13 is an internal circuit diagram exemplarily illustrating a first decoder 421 shown in FIG. 12.

Referring to FIG. 12, the first semiconductor package 420 includes the first decoder 421 and first to eighth semiconductor chips 422 to 429. The first decoder 421 is configured to generate the first to eighth chip selection signals LRA_CS0B to LRA_CS7B by decoding the first chip driving control signal CS0# and the first, second, and third common chip selection control signals KA0, KA1, and KA2. The first to eighth semiconductor chips 422 to 429 are selected based on the first to eighth chip selection signals LRA_CS0B to LRA_CS7B, respectively.

As illustrated in FIG. 13, the first decoder 221 includes an inverting unit 421A and a logic combining unit 421B. The inverting unit 421A inverts the first chip driving control signal CS0# and the first, second, and third common chip selection control signals KA0, KA1, and KA2, and outputs inverted signals CS0D, KA0B, KA1B, and KA2B. The logic combining unit 221B logically combines the first, second, and third common chip selection control signals KA0, KA1, and KA2 and the output signals CS0D, KA0B, KA1B, and KA2B of the inverting unit 221A, and outputs first to eighth chip selection signals LRA_CS0B to LRA_CS7B.

The inverting unit 421A includes first to fourth inverting circuits INV41, INV42, INV43, and INV44 for respectively inverting the first chip driving control signal CS0# and the first, second, and third common chip selection control signals KA0, KA1, and KA2.

The logic combining unit 421B may include first to eighth NAND gates NAND41 to NAND48. The first to eighth NAND gates NAND41 to NAND48 are each configured to perform a NAND operation onto a different combination of four signals from among the inverted first chip driving control signal CS0D, the first, second, and third common chip selection control signals KA0, KA1, and KA2, and the inverted first, second, and third common chip selection control signals KA0B, KA1B, and KA2B. As a result of the NAND operations, the first to eighth NAND gates NAND41 to NAND48 output the first to eighth chip selection signals LRA_CS0B to LRA_CS7B, respectively.

Since the second semiconductor package 430 has the same structure as the first semiconductor package 420, which is described above, a detailed description of the second semiconductor package 430 is omitted herein.

According to exemplary embodiments of the present invention, it is possible to reduce the number of channels of the external controller. Also, according to exemplary embodiments it is possible to reduce the number of pads included in a semiconductor package when a chip selection signal for selecting a semiconductor chip included in the semiconductor package is generated. Herein, the exemplary embodiments of the present invention include DDP and QDP semiconductor packages. However, semiconductor packages with various numbers of semiconductor chips therein may also be used by increasing the number of pads. Moreover, the advantages of the present invention may be more evident as the number of semiconductor chips that are stacked and packaged increases. For example, where the number of semiconductor chips is 8, 16, or 32, the advantages of the present invention may be more readily appreciated.

To be specific, the number of channels of the external controller may be reduced and/or the number of pads included in a semiconductor integrated circuit may be reduced by generating a control signal in the external controller and decoding the control signal into a chip selection signal in the semiconductor integrated circuit. When the number of the channels of the external controller used to drive the semiconductor chips is minimized, space is available for other channels for another purpose, which leads to an increased expandability. Also, as the number of pads included in the semiconductor integrated circuit is reduced, the area of the semiconductor integrated circuit can be reduced.

While the present invention has been described with respect to the specific embodiments, it will be apparent to those skilled in the art that various changes and modifications may be made without departing from the spirit and scope of the invention as defined in the following claims.

For example, the internal structures of the first decoders 121, 221, 321, and 421 in the exemplary embodiments of the present invention are not limited to those shown. On the contrary, diverse modifications to the first decoders may be made.

Also, as illustrated in the exemplary embodiments of the present invention, the semiconductor chips included in a semiconductor package may be enabled independently. But, the scope of the present invention is not limited to such features. On the contrary, various numbers of semiconductor chips may be enabled simultaneously according to a decoding method.

What is claimed is:

1. A semiconductor integrated circuit, comprising:
    a plurality of semiconductor chips respectively selected in response to a plurality of chip selection signals; and
    a chip selection signal generator configured to generate the chip selection signals by decoding at least one first control signal for deciding whether to drive the semiconductor chips and at least one second control signal for selecting at least one semiconductor chip from among the semiconductor chips, wherein the first control signal and the second control signal are encoded signals, and
    wherein the chip selection signal generator simultaneously enables the chip selection signals according to a logic level of the at least one second control signal when the at least one first control signal is at a logic low level.

2. The semiconductor integrated circuit of claim 1, further comprising:
    a plurality of pads configured to receive the first control signal and the second control signal.

3. The semiconductor integrated circuit of claim 2, wherein the number of the pads is equal to or less than the number of the semiconductor chips.

4. The semiconductor integrated circuit of claim 1, wherein the chip selection signal generator generates the chip selection signals by decoding the first control signal and the second control signal.

5. The semiconductor integrated circuit of claim 4, wherein the chip selection signal generator comprises:
    an inverting unit for inverting the first control signal and the second control signal and outputting inverted signals; and
    a logic combining unit for performing a logic combination onto the second control signal and the output signals of the inverting unit and outputting the chip selection signals.

6. The semiconductor integrated circuit of claim 1, wherein when the semiconductor chips are provided for a dual die package (DDP), the chip selection signal generator generates two chip selection signals in response to one first control signal and one second control signal.

7. The semiconductor integrated circuit of claim 1, wherein when the semiconductor chips are provided for a quad die package (QDP), the chip selection signal generator generates four chip selection signals in response to one first control signal and two second control signals or in response to two first control signals and one second control signal.

8. A semiconductor system, comprising:
    a controller configured to generate a plurality of chip selection signals by decoding a plurality of first control signals for controlling whether to drive a semiconductor chip and at least one second control signal for controlling which semiconductor chip to select; and
    a plurality of semiconductor integrated circuits, each of which comprises a plurality of semiconductor chips and is configured to select at least one semiconductor chip from among the semiconductor chips in response to a first control signal, corresponding to the selected semiconductor chip, from among the plurality of first control signals and the second control signal,
    wherein the chip selection signals are enabled simultaneously according to a logic level of the second control signal when the first control signal is at a logic low level.

9. The semiconductor system of claim 8, wherein each of the semiconductor integrated circuits further comprises:
    a first pad for receiving the first control signal corresponding to the selected semiconductor chip from among the plurality of first control signals; and
    at least one second pad for receiving the second control signal.

10. The semiconductor system of claim 9, wherein when the second control signal comprises a plurality of second control signals, each of the semiconductor integrated circuits receives each of the second control signals through a plurality of second pads, respectively.

11. The semiconductor system of claim 9, wherein the total number of the fust pads and the second pads is equal to or less than the number of the semiconductor chips.

12. The semiconductor system of claim 11, wherein when the semiconductor chips are provided for a dual die package (DDP), each of the semiconductor integrated circuits comprises one first pad and one second pad.

13. The semiconductor system of claim 11, wherein when the semiconductor chips are provided for a quad die package (QDP), each of the semiconductor integrated circuits comprises one first pad and two second pads.

14. The semiconductor system of claim 8, wherein the controller generates the first control signals and the second control signal based on an encoding method, and
    each of the semiconductor integrated circuits selects one semiconductor chip from among the semiconductor chips by decoding a first control signal, corresponding to the selected semiconductor chip, from among the plurality of first control signals and the second control signal.

15. The semiconductor system of claim 14, wherein each of the semiconductor integrated circuits further comprises:
    a chip selection signal generator configured to generate a plurality of chip selection signals for selecting one semiconductor chip from among the semiconductor chips, and
    the chip selection signal generator comprises:
    an inverting unit for inverting the first control signal, corresponding to the selected semiconductor chip, from among the multiple first control signals and the second control signal and outputting inverted signals; and
    a logic combining unit for performing a logic combination onto the second control signal and the output signals of the inverting unit and outputting the chip selection signals.

* * * * *